United States Patent

Ashby

[11] Patent Number: 5,861,781
[45] Date of Patent: Jan. 19, 1999

[54] SINGLE SIDEBAND DOUBLE QUADRATURE MODULATOR

[75] Inventor: Kirk Burton Ashby, Reading, Pa.

[73] Assignee: Lucent Technologies Inc., Murray Hill, N.J.

[21] Appl. No.: 931,370

[22] Filed: Sep. 16, 1997

[51] Int. Cl.⁶ .................................................... H03C 1/00
[52] U.S. Cl. .......................... 332/170; 375/270; 375/301; 455/47; 455/109
[58] Field of Search ............................ 332/170; 375/270, 375/301; 455/47, 109

[56] References Cited

U.S. PATENT DOCUMENTS 3,390,343  6/1968  Carter ........................................ 332/170
5,243,304  9/1993  Rixon ........................................ 332/170

Primary Examiner—Siegfried H. Grimm

[57] ABSTRACT

A method of and apparatus for effecting single sideband modulation which mixes and sums the quadrature and in-phase components of a baseband signal with the in-phase and quadrature components of an intermediate frequency (IF) signal to form in-phase and quadrature components of a sum signal having a frequency equal to the sum of the frequencies of the baseband and intermediate frequency signals and which mixes and sums the quadrature and in-phase components of an RF carrier signal with the in-phase and quadrature components of the sum signal to form a single-sideband signal.

11 Claims, 3 Drawing Sheets

SINGLE SIDEBAND DOUBLE QUADRATURE MODULATOR

FIELD OF THE INVENTION

This invention relates to single sideband, quadrature modulator circuits and, more particularly, to indirect quadrature modulator circuits.

BACKGROUND OF THE INVENTION

Single sideband modulation depends on the suppression of one of the sidebands. Heretofore it has been appreciated that the degree to which the unwanted sideband may be suppressed is dependent upon the accuracy of the phase shift of the local oscillator signal. The ideal phase shift is 90 degrees. Any deviation from 90 degree phase shift, degrades the suppression of the unwanted sideband. Typically, a phase shift error of less than one degree is desired. When modulators are manufactured using integrated circuits, it is particularly difficult to achieve such accuracy in the local oscillator phase shift at high radio frequencies (RF). Direct modulator architectures, such as that shown in FIG. 1, require that an accurate phase shift be done at high frequencies and are therefore difficult to design and manufacture.

To avoid the problem of achieving highly accurate phase shift, indirect modulation is often used, in which the phase shift circuitry is implemented at a lower intermediate frequency (IF), where it is easier to achieve the desired phase shift accuracy. An example of a typical indirect modulator architecture is shown in FIG. 2. In an indirect modulator, a quadrature modulator is used to generate a single sideband output at the intermediate frequency. An up-conversion mixer is used to mix the IF output with a radio frequency (RF) local oscillator. However the output of the up-conversion is no longer single sideband, as sidebands are produced at both the sum and difference of the IF and RF local oscillator frequencies. One of these sidebands will be selected and the other rejected by use of a filter such as FF2 shown in FIG. 2. The rejection requirements of this filter make it extremely difficult to implement on an integrated circuit, and therefore a filter external to the integrated circuit is typically used. In addition to eliminating the unwanted sideband, filter FF2 is also used to eliminate unwanted spurious signals and wideband noise that may be generated by the modulator. This function is also performed by filter FF1 of the direct modulator.

The mixers employed in the modulators are often considered to be linear multipliers in order to simplify analysis. The mixers can be thought of as having a linear input port where the information signal is applied (for example, I and Q are connected to the linear input port), and a non-linear switching port to which the local oscillator is applied. The non-linear switching action of the mixers creates outputs that are located at the harmonics of the IF oscillator. Some of the higher order harmonics will be comparable in frequency to the desired output and may interfere with the desired output signal. Other IF harmonics may re-mix in such a way that they create interfering spurious signals that can not be eliminated with filter FF2. Filter F1 of FIG. 2 is used to filter out the IF local oscillator harmonics. This helps to improve the spurious signal performance of the modulator. Required filter performance is not difficult to achieve and this filter is typically implemented on the integrated circuit.

To reduce the generation of undesirable spurious signals through the linear path of the modulator, the linearity of this path must be very good. Preceding the output buffers, the direct modulator of FIG. 1, and the indirect modulator of FIG. 2 can be designed so that the non-linearities are acceptably small for comparable signal levels. The largest contributor to non-linearity for each architecture is the output buffer. Using a power series expansion, the output buffer non-linearity can be analyzed as a function of its input voltage $V_{IN}$, as:

$$V_{OUT} = K_0 + K_1 V_{IN} + K_2 V_{IN}^2 + K_3 V_{IN}^3 + K_4 V_{IN}^4 + \ldots$$

When the coefficients $K_2$, $K_3$, $K_4$, etc., are each zero, the amplifier is considered to be perfectly linear. To improve linearity, it is necessary to reduce the non-linearities added by the higher order terms, $K_2 V_{IN}^2$, $K_3 V_{IN}^3$, $K_4 V_{IN}^4$, etc., either by decreasing the magnitude of the input voltage, $V_{IN}$, or by decreasing the magnitude of the non-linearity coefficients, $K_2$, $K_3$, $K_4$, etc. If we assume that output buffer OB1 (FIG. 1) is identical to output buffer OB2 (FIG. 2), and that the power of the desired output sideband should be the same for both the direct and indirect modulator when driving identical loads, we see that the indirect modulator of FIG. 2 will have poorer linearity than the direct modulator because both the desired and undesired sideband are present in OB2 and contribute equally to the output power. Accordingly, to achieve the requisite power for the desired sideband in the indirect modulator of FIG. 2, its $V_{IN}$ must be larger than the $V_{IN}$ of the direct modulator of FIG. 1 which produces only one sideband. Since we have assumed the output power in the desired sideband is identical, and that the output buffers are identical, the terms $K_2 V_{IN}^2$, $K_3 V_{IN}^3$, $K_4 V_{IN}^4$, etc., for the indirect modulator must be larger than the corresponding terms of the direct modulator.

In order to achieve linearity with an indirect modulator that is comparable to a direct modulator, it is necessary either to reduce the level of the input signals to the output buffer or to increase the linearity of the output buffer. Decreasing the input level results in a decrease in output level. This is usually made up with an additional amplifier between FF2 and the PA, an approach that requires additional power. Improving the linearity of the output buffer is typically done by increasing the power dissipated in the buffer. For either approach, the net result is that an indirect modulator, such as that shown in FIG. 2, results in a higher net power consumption in the end application.

A second issue to consider in the selection of a modulator architecture is the ease of implementing the frequency synthesizer portion of the local oscillators. It often simplifies the synthesizer design if the transmit frequency is generated as the sum or difference of a variable radio frequency and fixed intermediate frequency, the technique employed in indirect modulation. In a direct modulator, either these signals must be mixed together with a separate mixer, or the required frequency must be generated directly. Either solution adds complexity and cost to a system using a direct modulator.

In summary, the direct modulator is simple and has better linearity for a given power dissipation and output power than an indirect modulator. However, the accuracy required for the direct modulator's phase shifter operating at RF is difficult to achieve in practice, and the generation of the RF local oscillator may complicate the frequency synthesizer design. The indirect modulator is more complex and is not as linear as the direct modulator for a given power dissipation and output power. However, the accuracy required for the phase shifter operating at IF is easier to achieve than the same accuracy at RF as required by the direct modulator. The indirect modulator may also simplify frequency synthesizer design in some cases.

Accordingly, it would be desirable to combine the advantages of both the indirect modulator architecture and the direct modulator architecture while avoiding the disadvantages of these architectures.

SUMMARY OF THE INVENTION

In accordance with the principles of the present invention, as exemplified by the illustrative embodiment, a modulator architecture which (a) does not require a highly accurate phase shifter at RF, (b) is able to drive the output buffer with a single sideband signal and (c) generates the required output frequency as the sum or difference of an IF local oscillator and RF oscillator is achieved. In the illustrative embodiment, two quadrature modulators are implemented at an intermediate frequency (IF) and a third quadrature modulator is implemented at the radio frequency (RF). An IF local oscillator is phase shifted to produce local oscillator signals that are in quadrature. These signals are mixed with the quadrature components of a baseband signal to form four product signals. One pair of the product signals are added together while the other pair of product signals are subtracted from each other. The two resultant signals are single sideband signals that are also in quadrature. These signals are filtered to remove unwanted harmonics of the local IF oscillator and are then applied as inputs to a third quadrature modulator that multiplies them with RF local oscillator signals that have been phase shifted to be in quadrature. The multiplied outputs are then added or subtracted to select the desired single sideband output. The resultant high frequency, single sideband signal may then be applied to an output buffer amplifier which operates more linearly than one which had to pass both sidebands.

The IF quadrature modulators generate both a desired output and an undesired sideband separated by only twice the baseband frequency, which is typically small relative to the IF local oscillator frequency. For example, the baseband frequency may range from a few kHz to a few MHz, but the IF frequency is often in the range of several tens of MHz to a few hundred MHz. Because of the narrow spacing between sidebands, filtering to further reject the unwanted sideband is not practical and therefore rejection of the unwanted sideband is dependent on the accuracy of the quadrature modulation. For this reason, the phase shifter used to generate the quadrature IF local oscillator inputs must be quite accurate. However it is easier to achieve accurate phase shift at IF than at RF frequencies. In practice, however, complete cancellation of the unwanted sideband does not occur and some of the undesired sideband will be up-converted by the RF quadrature modulator and will appear in the output, but the separation from the desired sideband will still be only twice the baseband frequency. For ease of reference, this can be referred to as the unwanted in-channel sideband.

As mentioned, the RF quadrature modulator generates both a desired and an undesired sideband separated by twice the IF frequency, a separation large enough so that the unwanted sideband may be referred to as the out-of-channel sideband to distinguish it from the unwanted in-channel sideband. Because the present arrangement suppresses the undesired out-of-channel sideband, the signal level at the output buffer is smaller than would be present in a traditional indirect modulator such as that in FIG. 2. This results in better linearity through the output stage. While the unwanted out of channel sideband could be suppressed with a filter, in practice it is very difficult to implement such a filter on an integrated circuit. The present invention's use of quadrature cancellation of the unwanted out-of-channel sideband functions over a broad range of frequencies. Since sideband cancellation is just used to improve output buffer linearity, the amount of sideband suppression required is not great and the accuracy requirements of the RF phase shifter are greatly relaxed. For example, while a phase shifter accuracy of about 1 degree is required to achieve a rejection of 40 dB for the undesired in-channel (IF) sideband, a rejection of the out-of-channel sideband of about 25 dB is adequate to solve the linearity problem in the output buffer. This corresponds to a phase shift accuracy of around six degrees, which is easy to achieve even at radio frequencies.

DESCRIPTION OF THE DRAWING

The foregoing and other features of the present invention may become more apparent from a reading of the ensuing description when read together with the drawing, in which.

GENERAL DESCRIPTION

Figure 1:
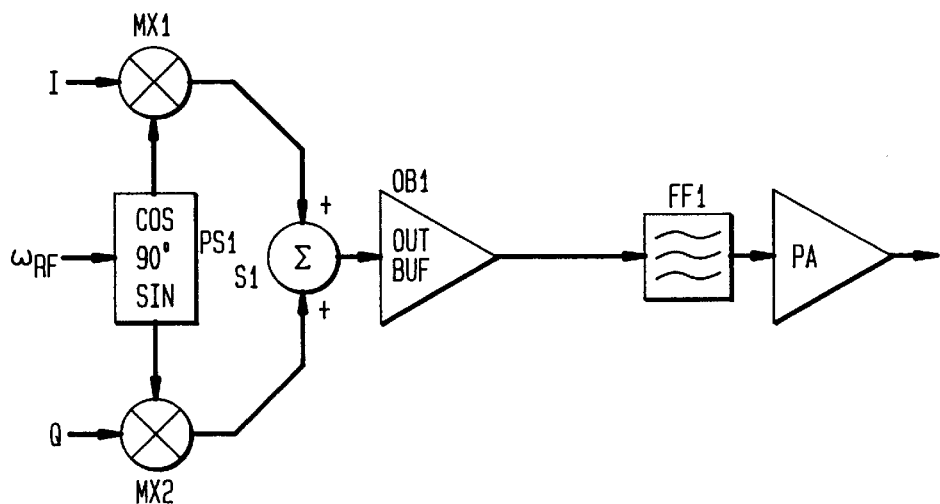
FIG. 1 depicts a prior art direct modulator.

Referring to FIG. 1, a prior art circuit for direct modulation of an RF carrier by a baseband signal is shown which relies on accurate production of 90° phase components of the RF local oscillator. A baseband source applies an in-phase quadrature signal $A_{BB} \cos(\omega_{BB}t)$ to input I of MX1 and quadrature phase signal $A_{BB} \sin(\omega_{BB}t)$ to input Q of mixer MX2. An RF local oscillator signal is applied to the phase shifter PS1 and the phase shifter produces outputs which are ideally 90° apart in phase but, in reality, differ from 90° by some phase error $\Delta\phi_{RF}$. These two outputs, including the phase error, can be expressed as $A_{RF} \cos(\omega_{RF}t+\Delta\phi_{RF}/2)$ and $A_{RF} \sin(\omega_{RF}t-\Delta\phi_{RF}/2)$. If the phase error, $\Delta\phi_{RF}$, is assumed to be zero, the output of mixer MX1 is given by:

$$A_{RF}A_{BB} \cos(\omega_{RF}t) \cos(\omega_{BB}t) = \tfrac{1}{2}A_{RF}A_{BB}[\cos(\omega_{RF}t-\omega_{BB}t)+\cos(\omega_{RF}t+\omega_{BB}t)] \quad (2)$$

With the same assumption of zero phase error, the output of mixer MX2 is given by:

$$A_{RF}A_{BB} \sin(\omega_{RF}t) \sin(\omega_{BB}t) = \tfrac{1}{2}A_{RF}A_{BB}[\cos(\omega_{RF}t-\omega_{BB}t)-\cos(\omega_{RF}t+\omega_{BB}t)] \quad (3)$$

The outputs of mixers MX1 and MX2 are added by summer S1 resulting in a single sideband output at frequency of $(\omega_{RF}-\omega_{BB})$. If the outputs of mixers MX1 and MX2 were subtracted in S1 instead of added, the output will be a single sideband at a frequency of $(\omega_{RF}+\omega_{BB})$. (Accordingly, "summing" as used herein embraces either adding or subtracting.)

When the phase error is not zero, cancellation of the unwanted sideband is not perfect. The sideband rejection ratio (SBRR) is defined as the magnitude of the unwanted sideband divided by the wanted sideband and can be shown to be equal to:

$$SBRR = 20 * \log_{10}[\sin(\Delta\phi_{RF}/2)/\cos(\Delta\phi_{RF}/2)] \quad (4)$$

In typical applications, an SBRR of about 40 dB is desirable. This corresponds to a phase of about 1°. Such accuracy is difficult to achieve in phase shifters employed at high frequencies as in the direct modulator of FIG. 1.

The wanted and unwanted sidebands are separated by only twice the baseband frequency, $\omega_{BB}$, which is typically a very small separation since the baseband frequency is low, it is not possible to reduce the unwanted sideband by means of filtering. Filter FF1 shown in FIG. 1 therefore does not improve the SBRR but merely reduces unwanted spurious signals that result from mixing and output noise in bands outside of the transmission channel. Filter FF1 usually has very stringent specifications that do not allow it to be integrated.

Figure 2:
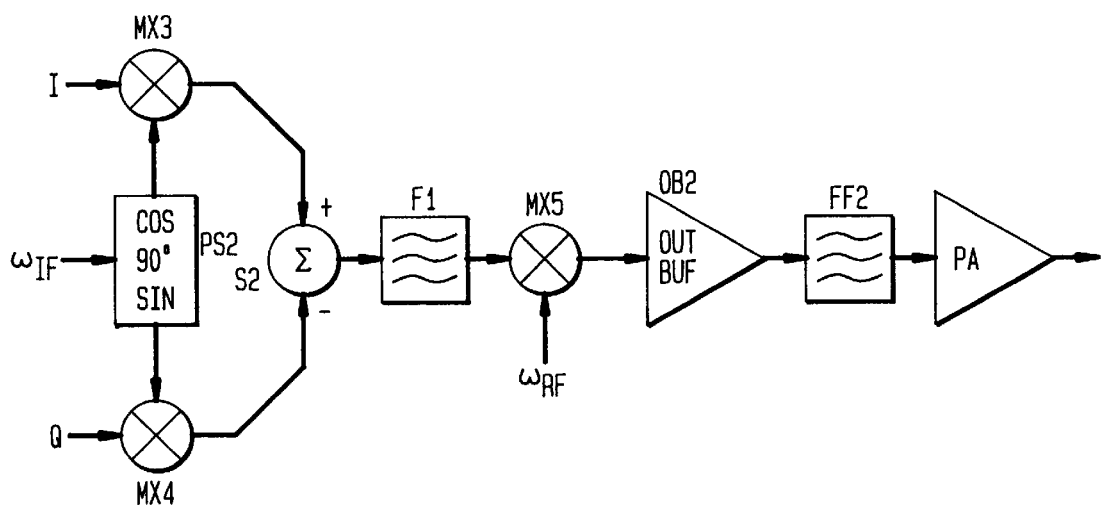
FIG. 2 shows a prior art form of indirect modulator.

In FIG. 2, a prior art indirect modulator architecture is shown. In this architecture, baseband source applies an in-phase quadrature signal, $A_{BB}\cos(\omega_{BB}t)$ to input I of mixer MX3 and a quadrature phase signal $A_{BB}\sin(\omega_{BB}t)$ to input Q of mixer MX4. An IF local oscillator signal is applied to phase shifter PS2 which produces outputs which are ideally 90° apart in phase but, in reality, differ from 90° by some phase error $\Delta\phi_{IF}$. These two outputs, including the phase error, can be expressed as $A_{IF}\cos(\omega_{IF}t+\Delta\phi_{IF}/2)$ and $A_{IF}\sin(\omega_{IF}t-\Delta\phi_{IF}/2)$. Neglecting phase error, the output of mixer MX3 is given by:

$$[A_{IF}A_{BB}\cos(\omega_{IF}t)\cos(\omega_{BB}t)=\tfrac{1}{2}A_{IF}A_{BB}[\cos(\omega_{IF}t-\omega_{BB}t)+\cos(\omega_{IF}t+\omega_{BB}t)] \quad (5)$$

while the output of MX4 is given by:

$$A_{IF}A_{BB}\sin(\omega_{IF}t)\sin(\omega_{BB}t)=\tfrac{1}{2}A_{IF}A_{BB1}[\cos(\omega_{IF}t-\omega_{BB}t)-\cos(\omega_{IF}t+\omega_{BB}t)] \quad (6)$$

The outputs of mixers MX3 and MX4 are applied to summer S2 of FIG. 2. If the outputs of mixers MX3 and MX4 are added, a single sideband output is provided at a frequency of $(\omega_{IF}-\omega_{BB})$. If the outputs of MX3 and MX4 are subtracted in summer S2 instead of added, a single sideband is provided at a frequency of $(\omega_{IF}+\omega_{BB})$.

When the phase error is not zero, cancellation of the unwanted sideband is not perfect. The sideband rejection ratio SBRR in this case is defined as:

$$SBRR=20*\log_{10}[\sin(\Delta\phi_{IF}/2)/\cos(\Delta\phi_{IF}/2)] \quad (7)$$

In typical applications, an SBRR of about 40 dB is desirable, corresponding to a phase error of about 1° which is much easier to achieve at the intermediate frequency used in the FIG. 2 architecture than the radio frequency used in the FIG. 1 architecture.

The IF output of summer S2 is filtered by filter F1 to reduce unwanted spurious signals that result from mixing. Depending upon the application, F1 may be integrated on-chip or it may be implemented as a filter external to the integrated circuit. Because the wanted and the unwanted IF sidebands are separated by twice $\omega_{BB}$, it is not possible to reduce the unwanted sideband by means of filtering and therefore Filter F1 shown in FIG. 2 does not improve the SBRR.

The filtered IF output is up-converted to the final output frequency by mixer MX5. Depending on which sideband is selected, $(\omega_{IF}-\omega_{BB})$ or $(\omega_{IF}+\omega_{BB})$, the output of MX5 will be given by one of the following equations:

$$[A_{RF}A_{IF}A_{BB}\cos(\omega_{RF}t)\cos(\omega_{IF}t+\omega_{BB}t)=\tfrac{1}{2}A_{RF}A_{IF}A_{BB}[\cos(\omega_{RF}t+(\omega_{IF}t+\omega_{BB}t))+\cos(\omega_{RF}t-(\omega_{IF}t+\omega_{BB}t))] \quad (8)$$

or $$[A_{RF}A_{IF}A_{BB}\cos(\omega_{RF}t)\cos(\omega_{IF}t-\omega_{BB}t)=\tfrac{1}{2}A_{RF}A_{IF}A_{BB}[\cos(\omega_{RF}t+(\omega_{IF}t-\omega_{BB}t))+\cos(\omega_{RF}t-(\omega_{IF}t-\omega_{BB}t))] \quad (9)$$

From equations (8) and (9) it is observed that the output of mixer MX5 will contain two signals of equal amplitude which are separated in frequency by twice the IF local oscillator frequency. Both signals contain identical information and only one will be used as the final output. The desired output will be selected and the other rejected by filter FF2 according to the application required. Since both of these signals must pass through output buffer OB2, this buffer must be designed to accommodate both of these signals without distortion. This is more difficult to achieve than was the case for the direct modulator of FIG. 1 where only one tone is applied to the output buffer. The result is that either more power must be dissipated in buffer OB2 to provide the same output power or, if the power dissipation and distortion levels are to be kept the same, the output power delivered by OB2 will be less than that delivered by output buffer OB1.

It would also be possible to place a filter before output buffer OB2 to filter out the unwanted signal and solve the distortion versus power dissipation problem. Putting such a filter on-chip limits the flexibility of the device since the filter must track all possible output frequencies. Flexibility can be maintained by using an external filter, but this increases the power dissipation of the chip by the power required to drive such a filter and may lead to instability problems if the output of OB2 is not sufficiently isolated from the output of the external filter. Applications would typically still require filter FF2 to reduce noise generated by buffer OB2. Since filter FF2 must be used to control noise, its saves cost to also use this filter to select the desired output.

Figure 3:
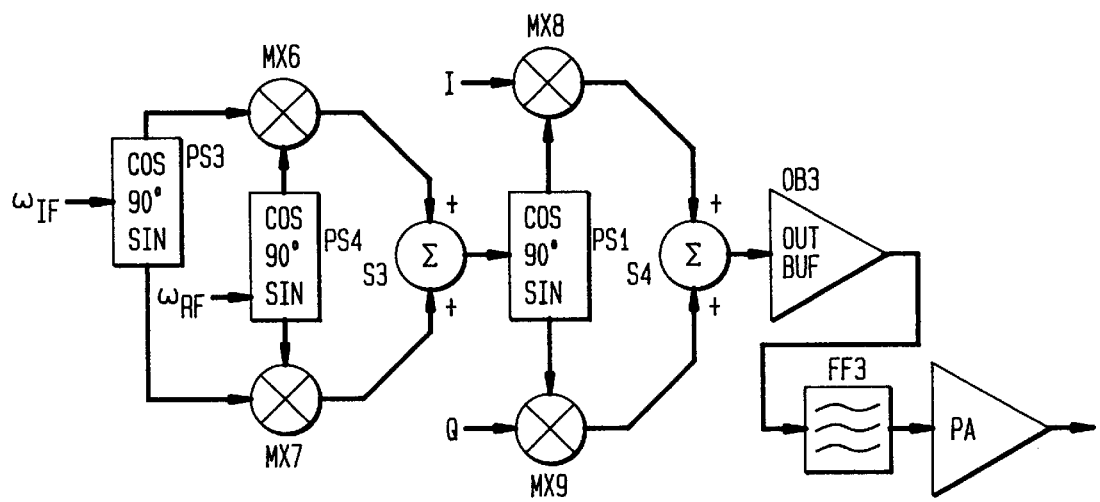
FIG. 3 shows a prior art direct modulator with quadrature mixed local oscillator.

The prior art circuit of FIG. 3 uses four mixers, three phase shifters and two summers. Mixers MX8 and MX9, summer S4, output buffer OB3, and filter FF3 are respectively similar in function to mixers MX1, MX2, summer S1 and output buffer OB1 of FIG. 1. Phase shifter PS3 splits the IF local oscillator into two signals that are ideally 90° apart. These form the effective in-phase and quadrature phase IF inputs to the direct modulator formed by MX6, MX7, PS4 and S3. The output of S3 is applied as the local oscillator signal to the direct modulator formed by MX8, MX9, PS5, S4, and OB3. Since this circuit consists of two direct modulators, the equations developed for the direct modulator apply to this circuit as well, except that the total phase error for the direct modulator formed by MX6, MX7, PS3, PS4 and S3 is the sum of the phase errors of PS3 and PS4. By varying whether the summers are used to add or subtract, an output may be obtained at the same frequencies as the indirect modulator of FIG. 2. The circuit of FIG. 3 provides the output stage distortion versus power advantage of the direct modulator of FIG. 1, and the synthesizer simplification advantage of the indirect modulator of FIG. 2. However, it still is limited in output frequency range by the phase shifter range of PS5, and has the added disadvantage that it now requires three phase shifters, all of which need to be accurate, and two of which are at RF where it is difficult to achieve the required accuracy.

Figure 4:
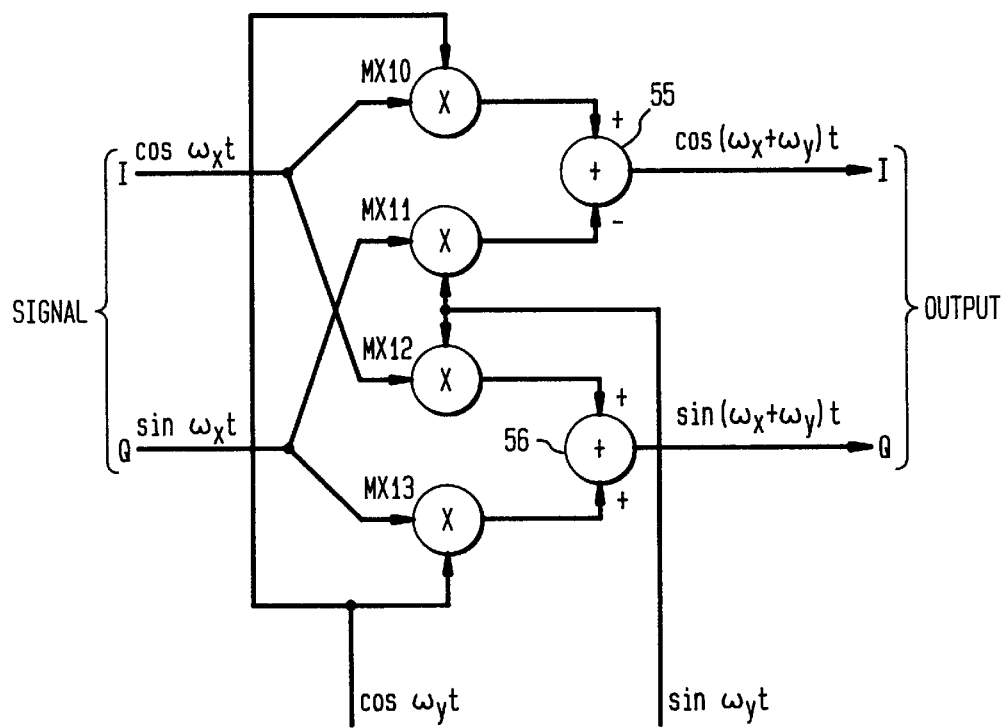
FIG. 4 shows a prior art form of single sideband circuit.

FIG. 4 shows a prior art circuit described in "Single Sideband Systems and Circuits" by Sabin and Schoenike, McGraw Hill, 1987, p. 23 which illustrates the concept of full complex mixing. This circuit includes four mixers, MX10, MX11, MX12, and MX13 and two summers S5 and S6 to separately multiply and sum the in-phase and quadrature components of two signals to produce two single sideband outputs which are also in phase quadrature. This circuit does not address the high frequency phase shift problem (it simply assumes that the required signals are available), the output stage linearity/power dissipation problem, nor the frequency synthesis problem.

Figure 5:
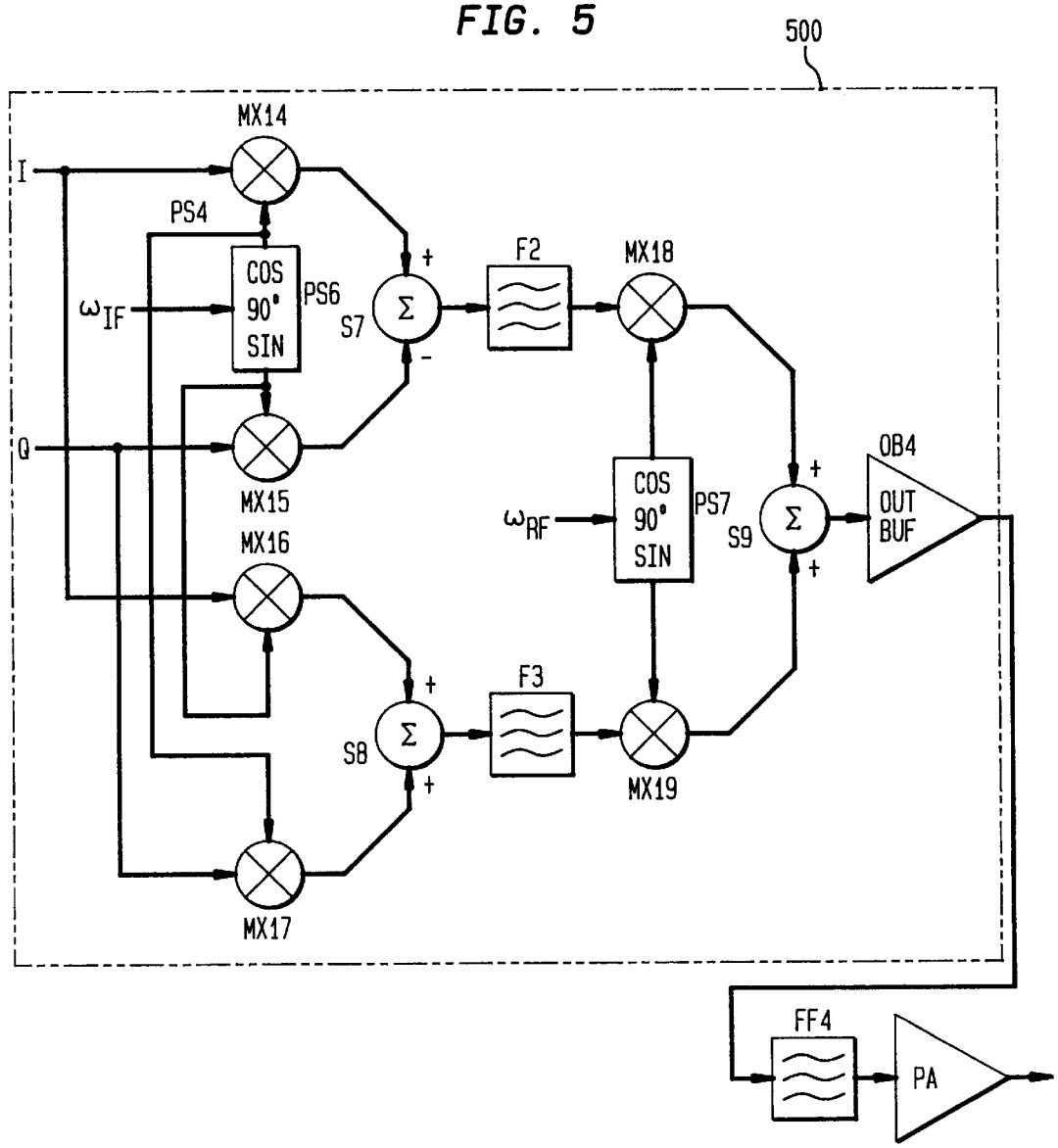
FIG. 5 shows the illustrative integrated circuit embodiment of a double quadrature modulator according to the invention.

Referring now to FIG. 5, an integrated circuit 500 provides an illustrative embodiment of the inventive modulation scheme which uses six mixers, three summers, and two phase shifters on a single integrated circuit chip which also, advantageously, includes two filters F2, F3 and an output buffer OB4. This circuit incorporates the advantages of both the direct modulator of FIG. 1 and the indirect modulator of FIG. 2 while avoiding the need for accurate phase shifting at RF, as was required in the circuits of FIGS. 1, 3 and 4. As will be shown, advantageously only the lower frequency IF phase shifter PS6 need be fabricated to have high accuracy while the higher frequency phase shifter PS7 which operates at RF need not have as high a degree of accuracy.

A baseband source applies an in-phase quadrature signal $A_{BB}\cos(\omega_{BB}t)$ to input I of mixers MX14 and MX16, and a quadrature phase signal $A_{BB}\sin(\omega_{BB}t)$ to input Q of mixers MX15 and MX17. An IF local oscillator signal is applied to the phase shifter PS6 which produces outputs which are ideally 90° apart in phase, but in reality differ from 90° by some phase error $\Delta\phi_{IF}$. These two outputs including the phase error can be expressed as $A_{IF}\cos(\omega_{IF}t+\Delta\phi_{IF}/2)$ and $A_{IF}\cos(\omega_{IF}t-\Delta\phi_{IF}/2)$. Neglecting phase error, the output of mixer MX14 is given by:

$$A_{IF}A_{BB}\cos(\omega_{IF}t)\cos(\omega_{BB}t) = \tfrac{1}{2}A_{IF}A_{BB}[\cos(\omega_{IF}t-\omega_{BB}t)+\cos(\omega_{IF}t+\omega_{BB}t)] \quad (10)$$

while the output of mixer MX16 is given by:

$$A_{IF}A_{BB}\sin(\omega_{IF}t)\sin(\omega_{BB}t) = \tfrac{1}{2}A_{IF}A_{BB}[\cos(\omega_{IF}t-\omega_{BB}t)-\cos(\omega_{IF}t+\omega_{BB}t)] \quad (11)$$

Similarly, the output of MX15 is given by:

$$A_{IF}A_{BB}\sin(\omega_{IF}t)\cos(\omega_{BB}t) = \tfrac{1}{2}A_{IF}A_{BB}[\sin(\omega_{IF}t+\omega_{BB}t)+\sin(\omega_{IF}t-\omega_{BB}t)] \quad (12)$$

while the output of MX17 is given by:

$$A_{IF}A_{BB}\cos(\omega_{IF}t)\sin(\omega_{BB}t) = \tfrac{1}{2}A_{IF}A_{BB}[\sin(\omega_{IF}t+\omega_{BB}t)-\sin(\omega_{IF}t-\omega_{BB}t)] \quad (13)$$

The outputs of MX14 and Mx15 are applied to summer S7 (shown as subtracting its inputs) resulting in a single sideband output of $A_{IF}A_{BB}\cos(\omega_{IF}t-\omega_{BB}t)$. The outputs of MX16 and MX17 are applied to summer S8 (shown as adding its inputs) resulting in an output of $A_{IF}A_{BB}\sin(\omega_{IF}t-\omega_{BB}t)$. These outputs are at the same frequency but are in phase quadrature. By subtracting in S7 instead of adding, and adding in S8 instead of subtracting, outputs given by $A_{IF}A_{BB}\cos(\omega_{IF}t+\omega_{BB}t)$ and $A_{IF}A_{BB}\sin(\omega_{IF}t+\omega_{BB}t)$ can be generated. The outputs of summers S7 and S8 are filtered by filters F2 and F3 respectively. These filters are used to reduce spurious signal products and the usual specifications allow them to be integrated on-chip.

The filtered outputs of S7 and S8 are respectively applied to one input of mixers MX18 and MX19 while a phase shifted RF signal is applied by phase shifter PS7 to the other input of each of these mixers which up-convert the signal to the output frequency. Neglecting the phase error, $\Delta\Phi_{RF}$, of phase shifter PS7, the output of MX18 will be given by one of the following equations:

$$A_{RF}A_{IF}A_{BB}\cos(\omega_{RF}t)\cos(\omega_{IF}t-\omega_{BB}t) = \tfrac{1}{2}A_{RF}A_{IF}A_{BB}\cos[\omega_{RF}t-(\omega_{IF}t-\omega_{BB}t)]+\cos[\omega_{RF}t-(\omega_{IF}t-\omega_{BB}t)] \quad (14)$$

or $$A_{RF}A_{IF}A_{BB}\cos(\omega_{RF}t)\cos(\omega_{IF}t+\omega_{BB}t) = \tfrac{1}{2}A_{RF}A_{IF}A_{BB}\cos[\omega_{RF}t+(\omega_{IF}t+\omega_{BB}t)]+\cos[\omega_{RF}t-(\omega_{IF}t+\omega_{BB}t)] \quad (15)$$

Depending on which IF sideband is selected, and depending on whether the outputs of MX18 and Mx19 are added or subtracted by summer S9, the output of S9 will be given by one of the following four equations:

$$A_{RF}A_{IF}A_{BB}\cos[\omega_{RF}t+(\omega_{IF}t-\omega_{BB}t)] \quad (16)$$

or:

$$A_{RF}A_{IF}A_{BB}\cos[\omega_{RF}t+(\omega_{IF}t+\omega_{BB}t)] \quad (17)$$

or:

$$A_{RF}A_{IF}A_{BB}\cos[\omega_{RF}t-(\omega_{IF}t-\omega_{BB}t)] \quad (18)$$

or:

$$A_{RF}A_{IF}A_{BB}\cos[\omega_{RF}t-(\omega_{IF}t+\omega_{BB}t)] \quad (19)$$

Because phase shifters PS6 and PS7 do not provide perfect phase shift, cancellation of the unwanted sidebands is not perfect and some residue of the unwanted sideband will remain. Error in the IF phase shifter PS6 will create an unwanted signal that is separated from the wanted signal by only twice the baseband signal. For example, if the wanted signal is at a frequency of $[\omega_{RF}t+(\omega_{IF}t-\omega_{BB}t)]$, an unwanted signal due to the IF phase error will be present at $[\omega_{RF}t+(\omega_{IF}t+\omega_{BB}t)]$. Such a signal is in-channel and cannot be filtered. In order to reduce this signal to an acceptable level, high accuracy must be maintained in the IF phase shifter PS6. The sideband rejection ratio SBRR, defined as the magnitude of the unwanted, in-channel sideband divided by the wanted sideband is given by equation (7). In typical applications, an SBRR of about 40 dB is desirable.

The error in phase shifter PS7 causes an unwanted output signal that is separated from the wanted signal by twice the IF local oscillator frequency which is sufficiently great that the undesired sideband can be referred to as out of band. This signal can be filtered by FF4 and will not appear in the final signal transmitted by the system. However, it is present at the input to the output buffer OB4, and contributes to the output stage linearity problem. In order to avoid the linearity problem, it is necessary to reduce the amplitude of the unwanted signal so that it is small relative to the wanted signal. In practice, a reduction of 20 to 25 dB is sufficient. A 25 dB reduction is equivalent to a phase error of about 6° and achieving this is relatively easy even at high frequencies.

In summary, the circuit of FIG. 5 exhibits the advantages of requiring an accurate phase shifter only at the IF local oscillator frequency, avoiding non-linear operation in the output stage and achieving a simplified frequency synthesis over a broader range of frequencies than direct modulation. What has been described is deemed to be illustrative of the principles of the invention. Numerous modifications may be made by those skilled in the art without, however, departing from the spirit and scope of the invention.

What is claimed is:

1. A method of effecting single sideband modulation, comprising the steps of a. mixing in-phase components of baseband and intermediate frequency signals;

b. mixing quadrature components of the baseband and intermediate frequency signals;

c. summing the results of mixing steps a and b;

d. mixing an in-phase component of the baseband signal with a quadrature component of the intermediate frequency signal;

e. mixing a quadrature component of the baseband signal with an in-phase component of the intermediate frequency signal;

f. summing the results of mixing steps d and e; and g. mixing and summing the results of steps c and f with the in-phase and quadrature components of an RF signal to produce a single sideband output signal.

2. A method of effecting single sideband modulation, comprising the steps of:

a. mixing and summing the quadrature and in-phase components of a baseband signal with the in-phase and quadrature components of an intermediate frequency (IF) signal to form in-phase and quadrature components of a signal having a frequency equal to the sum and difference of the baseband and intermediate frequency signals; and b. mixing and summing the quadrature and in-phase components of an RF carrier signal with the in-phase and quadrature components of said sum and difference signals to form a single-sideband signal.

3. A method of effecting single sideband modulation, comprising the steps of:

a. forming two single sideband intermediate frequency signals that are in quadrature;

b. filtering to remove unwanted harmonics of the intermediate frequency;

c. multiplying the filtered intermediate frequency single sideband signals with phase shifted quadrature radio frequency signals to form a pair of product signals; and d. adding or subtracting the product signals to select the desired single sideband output.

4. The method of claim 3 wherein the single sideband output is buffered.

5. A single sideband modulator architecture for generating a desired output frequency as the sum or difference of an IF local oscillator frequency and an RF oscillator to drive an output buffer with a single sideband signal without employing a highly accurate phase shifter at RF, comprising:

a. mixing an in-phase component of a baseband signal with the in-phase component of an IF signal;

b. mixing a quadrature component of the baseband signal with the quadrature component of the IF signal;

c. summing the results of mixing steps a and b;

d. mixing an in-phase component of the baseband signal with a quadrature component of the IF signal;

e. mixing a quadrature component of the baseband signal with an in-phase component of the IF signal;

f. summing the results of mixing steps d and e; and g. mixing and summing the results of steps c and f with an in-phase and a quadrature component of an RF signal to produce a single sideband signal.

6. A method of modulating a radio frequency signal with a baseband signal having in-phase and quadrature components, comprising:

a. mixing each component of the baseband signal with each of a pair of phase-shifted components of an intermediate frequency signal to form two pairs of product signals;

b. separately summing each pair of product signals to form a pair of modulated intermediate frequency signals;

c. mixing each of the modulated intermediate frequency signals with phase-shifted components of a radio frequency signal; and d. summing the products of the modulated intermediate frequency signals and the phase shifted components of the radio frequency signal.

7. The method of claim 6 wherein the summed products of the modulated intermediate frequency signals and the phase shifted components of the radio signal are filtered to remove unwanted harmonics of the intermediate frequency and then applied to an output buffer.

8. Apparatus for effecting single sideband modulation, comprising:

a circuit for mixing and summing the quadrature and in-phase components of a baseband signal with the in-phase and quadrature components of an intermediate frequency (IF) signal to form in-phase and quadrature components of a signal having a frequency equal to the sum and difference of the baseband and intermediate frequency signals; and a circuit for mixing and summing the quadrature and in-phase components of an RF carrier signal with the in-phase and quadrature components of said sum and difference signals to form a single-sideband signal.

9. Integrated circuit apparatus for effecting single sideband modulation, comprising:

a first mixer circuit adapted to mix in-phase components of baseband and intermediate frequency signals;

a second mixer circuit adapted to mix quadrature components of the baseband and intermediate frequency signals;

a first summer for summing the outputs of said first and second mixer circuits;

a third mixer circuit adapted to mix an in-phase component of the baseband signal with a quadrature component of the intermediate frequency signal;

a fourth mixer circuit adapted to mix a quadrature component of the baseband signal with an in-phase component of the intermediate frequency signal;

a second summer for summing the outputs of said third and fourth mixer circuits;

a fifth mixer circuit adapted to mix the output of said first summer with the in-phase component of an RF signal;

a sixth mixer circuit adapted to mix the output of said second summer with the quadrature component of said RF signal; and a third summer for summing the outputs of said fifth and sixth mixer circuits to produce a single sideband output signal.

10. Integrated circuit apparatus for effecting single sideband modulation according to claim 9, wherein a first filter is interposed between said first summer and said fifth mixer and a second filter is interposed between said second summer and said sixth mixer to remove spurious frequency components of said mixing.

11. Integrated circuit apparatus for effecting single sideband modulation according to claim 10 further comprising an output buffer connected at the output of said third summer and wherein all of said aforementioned components are fabricated on a single integrated circuit chip.

* * * * *

UNITED STATES PATENT AND TRADEMARK OFFICE
CERTIFICATE OF CORRECTION

PATENT NO. : 5,868,781

DATED : February 9, 1999

INVENTOR(S) : KILLION

It is certified that error appears in the above-identified patent and that said Letters Patent is hereby corrected as shown below:

At column 3, line 19, "1I" should be --17--.

Signed and Sealed this

Thirteenth Day of July, 1999

Attest:

Q. TODD DICKINSON

Attesting Officer

Acting Commissioner of Patents and Trademarks